United States Patent [19]

Tsai et al.

[11] Patent Number: 5,833,817
[45] Date of Patent: Nov. 10, 1998

[54] METHOD FOR IMPROVING CONFORMITY AND CONTACT BOTTOM COVERAGE OF SPUTTERED TITANIUM NITRIDE BARRIER LAYERS

[75] Inventors: Chia Shiung Tsai; Ying Yin Wang; Chen-Hua Douglas Yu, all of Hsiu-Chu, Taiwan

[73] Assignee: Taiwan Semiconductor Manufacturing Company, Ltd., Hsin-Chu, Taiwan

[21] Appl. No.: 635,825

[22] Filed: Apr. 22, 1996

[51] Int. Cl.$^6$ .................. C23C 14/34; H01L 21/465; B05D 5/12

[52] U.S. Cl. .................. 204/192.17; 438/694; 438/696; 438/697; 438/699; 438/700; 438/702; 438/703; 438/712; 438/714; 438/725; 438/733; 438/734; 438/738; 438/648; 438/656; 438/685; 427/97

[58] Field of Search .................. 204/192.17, 192.25; 427/96, 97, 99; 438/694, 695, 696, 697, 699, 700, 702, 703, 712, 714, 725, 733, 734, 738, 582, 648, 656, 685; 430/313

[56] References Cited

U.S. PATENT DOCUMENTS

| | | | |
|---|---|---|---|
| 4,960,732 | 10/1990 | Dixit et al. | 437/192 |
| 5,312,773 | 5/1994 | Nagshima | 437/190 |
| 5,387,550 | 2/1995 | Cheffings et al. | 437/189 |
| 5,462,895 | 10/1995 | Chen | 437/200 |

OTHER PUBLICATIONS

S. Wolf, "Silicon Processing for The VLSI Era–vol. 2,", Lattice Press, Sunset Beach, CA, pp. 247–248, undated.

*Primary Examiner*—Nam Nguyen
*Assistant Examiner*—Rodney G. McDonlald
*Attorney, Agent, or Firm*—George O. Saile; Stephen B. Ackerman

[57] ABSTRACT

A method is described for overcoming the non-conformity and poor step coverage incurred when materials such as metals and barrier layers are deposited into contact openings by physical-vapor-deposition(PVD) techniques such as sputtering and evaporation. Conventional PVD deposition into a vertical walled opening results in a deposit whose thickness diminishes towards the base of the opening. This causes voids when the opening is subsequently filled by chemical-vapor-deposited(CVD) tungsten as well as potential failure of the barrier material due to inadequate coverage at the base of the opening. The method utilizes a two stage reactive ion etching technique to selectively etch the upper portion of the deposited layer while protecting the lower portion with photoresist. A second deposition of barrier layer material then restores material at the top of the opening while augmenting the thickness at the base. This reduces the negative taper of the opening and allows total filling by the subsequent CVD deposition.

24 Claims, 6 Drawing Sheets

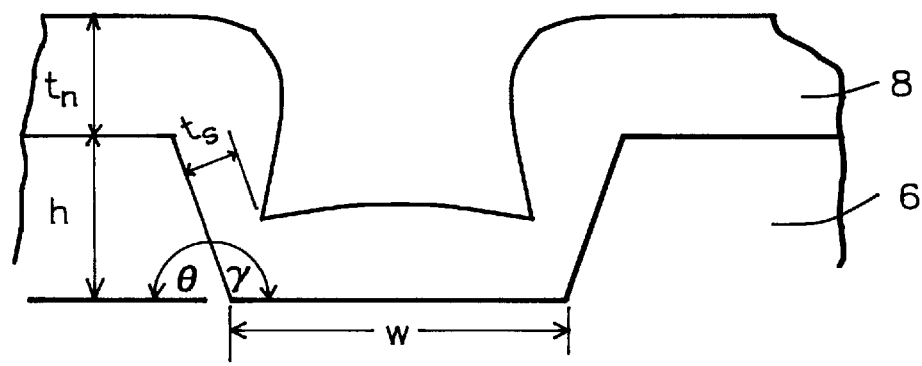
FIG. 1 – Prior Art
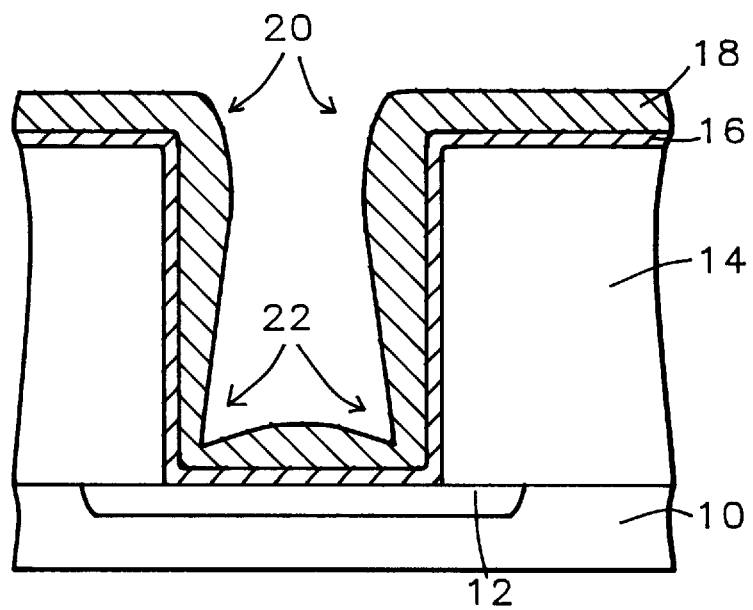
FIG. 2A – Prior Art

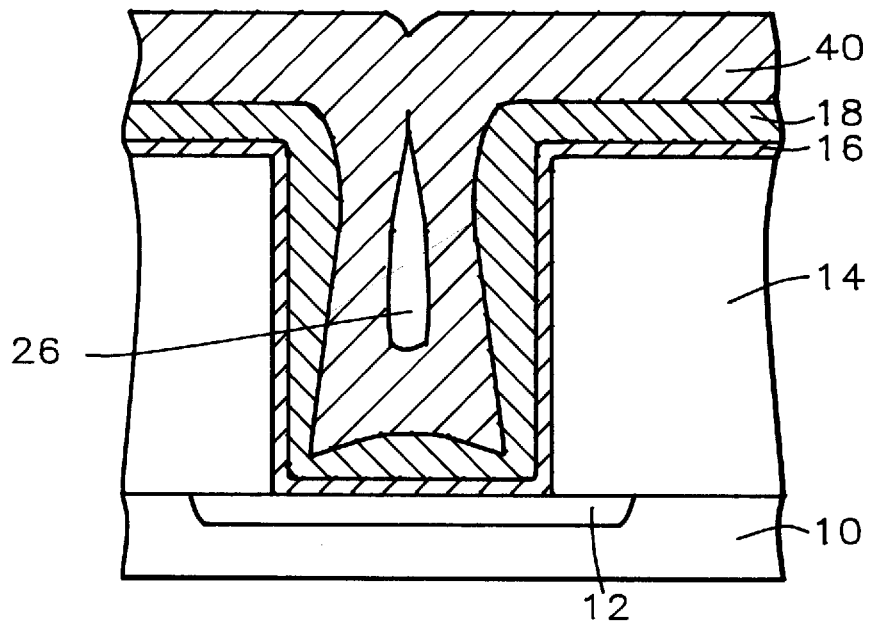
FIG. 2B – Prior Art
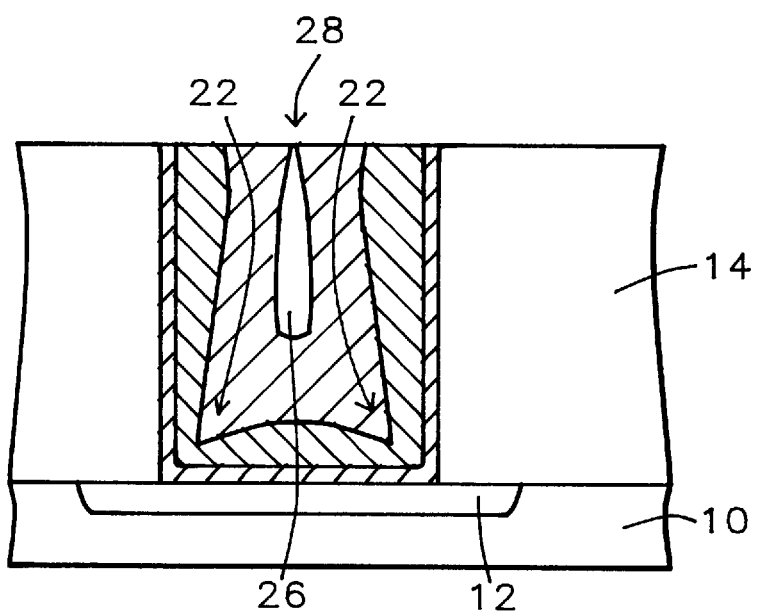
FIG. 2C – Prior Art

METHOD FOR IMPROVING CONFORMITY AND CONTACT BOTTOM COVERAGE OF SPUTTERED TITANIUM NITRIDE BARRIER LAYERS

BACKGROUND OF THE INVENTION (1) Field of the Invention

The invention relates to processes for the manufacture of semiconductor devices and more particularly to processes for forming metal-to-silicon contacts.

(2) Description of Prior Art

The use of tungsten in the fabricating of very-large-scale-integrated(VLSI) circuits has been practiced since the mid 1980s. As a conductive material tungsten does not rank as high as aluminum, which has been the primary conductor used in micro-circuit chip technology for nearly forty years. On the other hand, tungsten provides many features which make it an important material for fabricating metal-to-silicon contacts. In this capacity tungsten is deposited into contact openings, vertically etched into an insulating layer covering the silicon wafer. These contact openings expose active areas of the subjacent semiconductor devices. The tungsten plugs thus formed are connected to aluminum alloy conductors on the upper surface of the insulating layer. The short length of conductive path thus provided by the tungsten plug has no significant impact on the conductivity of the overall interconnect line.

Chemical-vapor-deposited(CVD) tungsten has proven to be an excellent material for such interconnect applications because of its low resistance, low stress(less than $5\times10^9$ dynes/cm$^2$), and a coefficient of thermal expansion which closely matches that of silicon. In addition tungsten has a high resistance to electromigration which is a common problem with aluminum its alloys. CVD tungsten can be deposited at temperatures around 400° C. with good conformity and step coverage.

Although tungsten does not bond well to either silicon or to the adjacent silica based insulating layer, a thin layer(less than 1,000 Angstroms) of titanium(Ti) is often used as a bonding agent to the silicon. Dixit et.al. U.S. Pat. No. 4,960,732 describe the formation of a tungsten plug contact utilizing Ti as a bonding agent, followed by a layer of titanium nitride(TiN) which acts as a diffusion barrier to prevent dopants from passing from the silicon as well as spiking of metal into the silicon. The Ti layer, when thermally annealed, fuses with the silicon to form titanium silicide(TiSi$_2$) and with the silica based insulating layer to form a titanium silicate(Ti$_x$SiO$_y$). Adhesion of the TiN to the Ti and subsequently to the tungsten is considered excellent.

The Ti-TiN-W composite tungsten plug metallurgy has been widely accepted and various techniques for its formation have been described. In the earliest teachings such as those of Dixit et.al., the Ti an TiN layers were deposited by sputtering, although CVD is also claimed. The sputtering can be accomplished by first sputtering a titanium target with argon to form the Ti layer and then admitting nitrogen, thereby sputtering reactively, to form the TiN layer. Alternatively, a multi-target sputtering tool can be used having a Ti target and a TiN target so that the layers may be deposited during a single evacuation cycle by switching targets within the tool. Successive deposition of the Ti and the TiN layers during a single pumpdown is desirable because exposure of the Ti layer to atmosphere will immediately result in the formation of a native oxide layer which can compromise the resistivity of the contact if not removed prior to the deposition of the TiN.

The good conformity and step coverage afforded by tungsten is due in large part to the nature of the deposition process itself. In the CVD process, particularly with low-pressure-chemical-vapor-deposition(LPCVD), the chemical reaction which forms the product occurs at the heated surface of the material receiving the deposition. Physical-vapor-deposition(PVD) processes such as evaporation or sputtering, on the other hand, cannot provide such conformity and edge coverage because the material being deposited arrives from discrete regions distant from its final location. This lends directionality to the process and consequently those regions of a receiving substrate which face the source of the particle stream receive a greater amount of deposit than those topological features not normal to the particle stream.

A computer simulation of film deposition by dc magnetron sputtering into an opening similar to that used for integrated circuit contacts is shown in FIG. 1.(adapted from S. Wolf and R. N. Tauber, "Silicon Processing for the VLSI Era", Vol.I, Lattice Press, Long Beach,Calif.,(1986) p.366). A layer of material 8 of nominal thickness $t_n$ is sputter deposited onto a substrate material 6 having an opening with base w and height h. The step coverage is defined by the minimum thickness of the film $t_s$ divided by its nominal thickness $t_n$ expressed in percent. In this example the opening has a taper expressed by the angle 90-Θ which favors better step coverage than the vertical walled contact openings under consideration here.

The minimum thickness in the contact openings occurs near the base as is also shown in FIG. 2A. Openings with a high aspect ratio h÷w(FIG. 1) can have insufficient coverage along the base corners of the opening. Step coverage can be improved to some extent by heating of the wafer. This allows surface migration of the depositing species to occur, thereby improving conformity.

Consequently the sputtering processes for the deposition of Ti and TiN have the shortcomings of poor step coverage. This is illustrated in a prior art cross section shown in FIG. 2A. A semiconductor wafer 10, having an active area diffusion 12 has an insulating layer 14 into which contact openings have been made and a thin layer of Ti 16 followed by a thicker layer of TiN 18 have been deposited by sputtering. Inadequate step coverage causes the negatively tapered overhang of TiN 20. A subsequently deposited tungsten layer, which is postured to fill the opening, prematurely pinches off before the lower portion of the opening is filled. The result is a void 26 shown in FIG. 2B. When the tungsten layer is etched back to the insulating layer 14(FIG. 2C), completing the formation of the tungsten plug contact, the void 26 is exposed at 28 creating a potential reliability defect. Exposed voids are highly susceptible to absorption of moisture or other corrosive contaminants.

Additionally, coverage of TiN in the vicinity of the base corners of the opening 22 can be precariously thin so as to place the barrier functionality of the layer at risk.

Chen U.S. Pat. No. 5,462,895 also points out this step coverage shortcoming but does not indicate the occurrence of voids in the tungsten. However, such voids have been observed by scanning-electron-microscopy(SEM). They have also been encountered by Cheffings et.al. U.S. Pat. No. 5,387,550 who, rather than seeking to avoid them, treat them after-the-fact by over-etching the tungsten plug into the void and filling the void and the top of the opening with polysilicon. In doing so they also etch deeply into the TiN along the walls of the contact openings.

Kim U.S. Pat. No. 5,397,742, on the other hand, describes a procedure whereby the need for excessive over-etching is avoided by providing a lift-off layer of titanium silicide which is etched away after the tungsten etch back, thereby lifting off tungsten residues without over etching the plug itself and, presumably, without exposing the voids.

Void formation is generally avoided by methods that employ selective CVD deposition of the tungsten plug. Here the plug grows upwards from the conductive layer at the bottom of the opening. The walls of the opening are lined with silicon oxide upon which deposition does occur. Such a technique has been described by Nagashima U.S. Pat. No. 5,312,773. Here the plug is formed by two tungsten depositions separated by an oxide etch.

Chen resolved the edge coverage problem by using CVD for the deposition of the Ti and TiN layers, thereby achieving better conformity. However, because of thermal budget restraints and other processing restraints, CVD is not always a viable option.

SUMMARY OF THE INVENTION

Accordingly, it is a purpose of this invention to provide a method for forming void-free tungsten plug contacts within openings having an Ti-TiN metallurgy deposited by sputtering. It is a further purpose of this invention to provide a method to augment the thickness of sputtered TiN layer in the base region of contact openings wherein the layers are conventionally at their thinnest. The method utilizes an initial TiN sputter deposition followed by the deposition of photoresist into the opening. The photoresist and TiN are then etched back with an anisotropic etch, preferably reactive-ion-etching(RIE). The regimen for this etchback involves first etching under conditions producing in a high selectivity of photoresist-to-TiN to expose the TiN layer. RIE conditions are then altered to favor TiN etching over photoresist. During this period the upper portion of the TiN layer is partially etched and the overhanging portion is reduced. Photoresist in the base of the opening protects the TiN in the lower region of the opening.

The photoresist is then removed and a second layer of TiN is deposited by sputtering. This layer builds up the coverage at the base while restoring the previous coverage at the top. The result is an opening in which the TiN coverage is nearly conformal. The subsequently deposited tungsten is free of voids and is provided with ample TiN barrier capacity.

BRIEF DESCRIPTION OF THE DRAWINGS

FIG. 1 is a cross section of a layer of material deposited into an opening by dc magnetron sputtering as calculated by a computer simulation.

FIG. 2(A–C) are cross sections of the steps of a prior art process for forming tungsten plug contact with sputtered Ti-TiN barrier metallurgy.

DESCRIPTION OF THE PREFERRED EMBODIMENTS

Figure 3A:
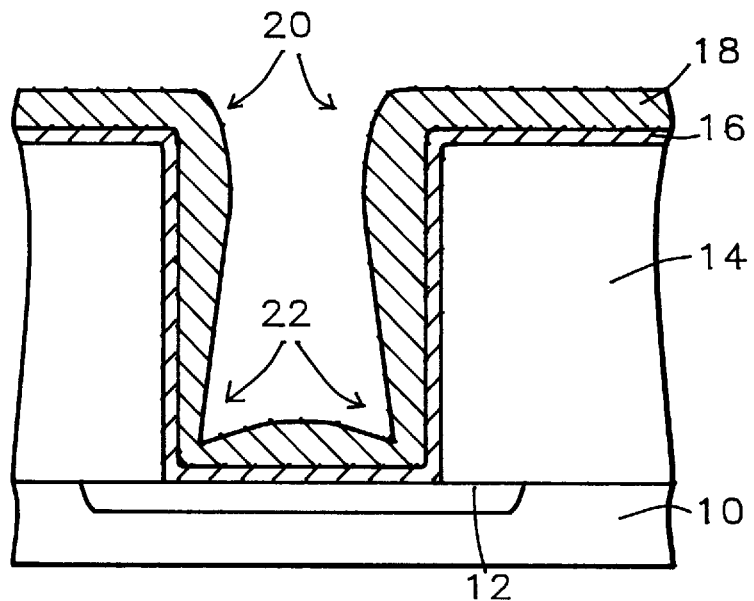
FIG. 3(A–H) are cross sections of the steps of the process for forming a tungsten plug contact with sputtered Ti-TiN barrier metallurgy as taught by this invention.

Referring now to FIG. 3A, a p-doped <100> oriented monocrystalline silicon wafer 10 is provided. Using standard processing techniques familiar to those in the integrated circuit manufacturing industry, semiconductor devices such as self-aligned polysilicon gate field-effect-transistors, are formed within the surface of the silicon wafer. The heavily doped source and drain implants of arsenic or phosphorous 12 comprise the active areas of these devices to which metallic contacts are to be formed. At the point of insertion of this invention a layer of borophosphosilicate glass(BPSG) 14 between 5,000 and 15,000 Angstroms thick has been deposited onto the silicon surface and contact openings have been patterned and etched into it using RIE. The photoresist mask used to pattern the contact openings is next removed by oxygen plasma ashing and wafer is given a dip etch in hydrofluoric acid(HF) diluted 50:1 with water to remove any native silicon oxide film in the contact openings.

Layer 14 could be a top or a central layer in a stack of insulating layers consisting of a borophosphosilicate glass and a phosphosilicate glass.

A layer of Ti 16 between 300 and 600 Angstroms thick and a layer of TiN 18 between 1,000 and 2,000 Angstroms thick are deposited over the wafer by rf sputtering. The method of sputtering can be either from a single titanium target utilizing argon, to first sputter the Ti layer 16, and then admitting nitrogen to reactively sputter the TiN layer 18, or by utilizing a multi-target sputtering tool having a Ti target and a TiN target. The two layers are deposited sequentially without breaking vacuum. The wafer is heated to about 400° C. to increase the surface mobility of the sputtered materials and thereby enhance edge coverage.

The wafer is then exposed to a rapid-thermal-annealing (RTA) cycle creating temperatures from 650° C. to 850° C. During this period which normally lasts for about 30 seconds, the titanium layer reacts with the silicon to form $TiSi_2$ and, at the same time, forms an intimate chemical bond with the BPSG by forming titanium silicate. Implanted dopant atoms in the silicon are electrically activated during this step.

A scrubber cleaning step is next performed if necessary to remove any large particles from the TiN surface.

Figure 3B:
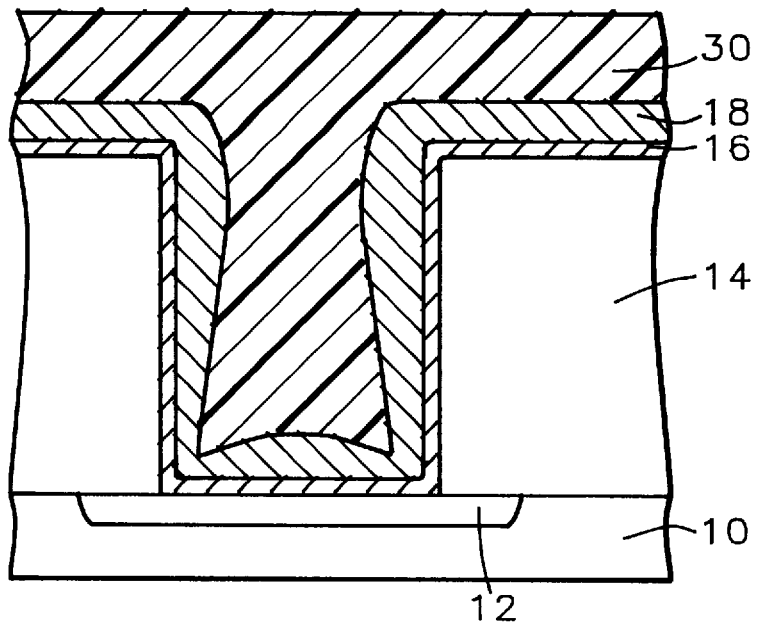

Referring next to FIG. 3B, a layer of photoresist 30, nominally 3,000 Angstroms thick is deposited over the wafer using a commercial apparatus spinning at 3,000 rpm. Any low viscosity photoresist is preferred for this embodiment such as TL-100A2 manufactured by Sumitomo Chemical Taiwan Company, Limited, 6F-3, No.369 Fu-Shing North Road, Taipei, Taiwan, R.O.C. Tel.(2)545-6345, FAX (2)545-6333. The photoresist is then cured by conventional baking procedures.

After baking, the wafer is placed in an RIE tool and subjected to anisotropic etching using a recipe wherein the etch-rate-ratio(selectivity) of TiN-to-Photoresist is 0.78(See Step #1 in Table I).

TABLE I

RIE conditions and Etch Selectivities . . .

| Gases | Flow Rate (SCCM*) | Magnetron Field(G) | Pressure (mTorr) | rf Power (Watts) | Selectivity (TiN/Photoresist) |
|---|---|---|---|---|---|
| Step #1: | | | | | |
| $BCl_3$ | 30 | 20 | 30 | 250 | 0.78 |
| $Cl_2$ | 10 | | | | |
| $N_2$ | 15 | | | | |
| Step #2: | | | | | |
| $BCl_3$ | 45 | 30 | 250 | 400 | 2.5 |
| $Cl_2$ | 25 | | | | |
| $N_2$ | 15 | | | | |

*Standard cubic centimeters per minute.

Figure 3C:
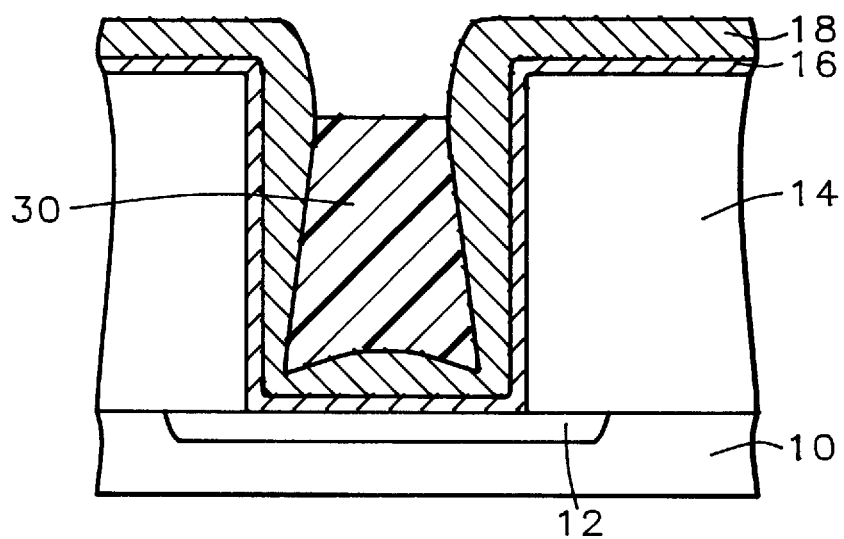

A selectivity of less than unity is used to achieve a depth of the photoresist just at or below the level where the TiN wall taper begins to turn negative (FIG. 3C). The attainment of this level is determined by endpoint detection using Optical emission spectroscopy and detecting on the peak at 396 nm.

Figure 3D:
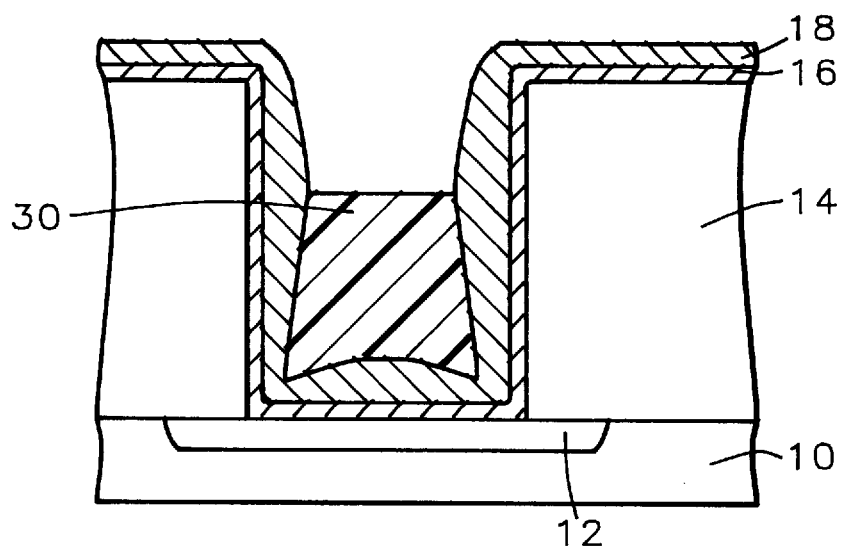

Thereafter, the conditions of the RIE are modified to reflect a TiN-to-Photoresist selectivity of 2.5(Step #2 in Table I). Under these conditions the TiN overhang is etched back nearly to the Ti layer while the photoresist, etching now more slowly, protects the TiN layer in the lower portion of the contact opening. Not only do the modified conditions under step #2 favor etching of the TiN over the photoresist, the higher pressure utilized causes the etching of the TiN to be more isotropic, thereby increasing the lateral removal rate of the overhang as well. The duration of this etch cycle is determined by elapsed time. Typically the TiN thickness within the sidewall is reduced by one-half. The cross section of FIG. 3D illustrates the contact opening at the end of RIE etching.

Figure 3E:
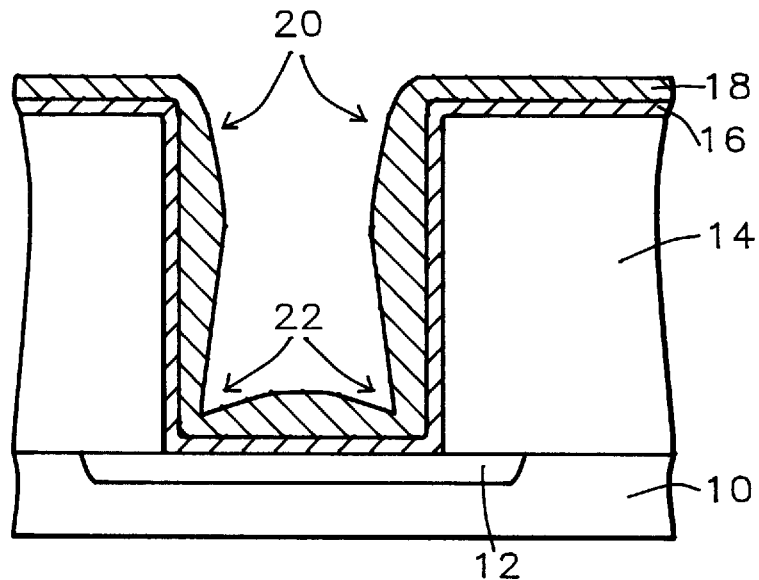
Figure 3F:
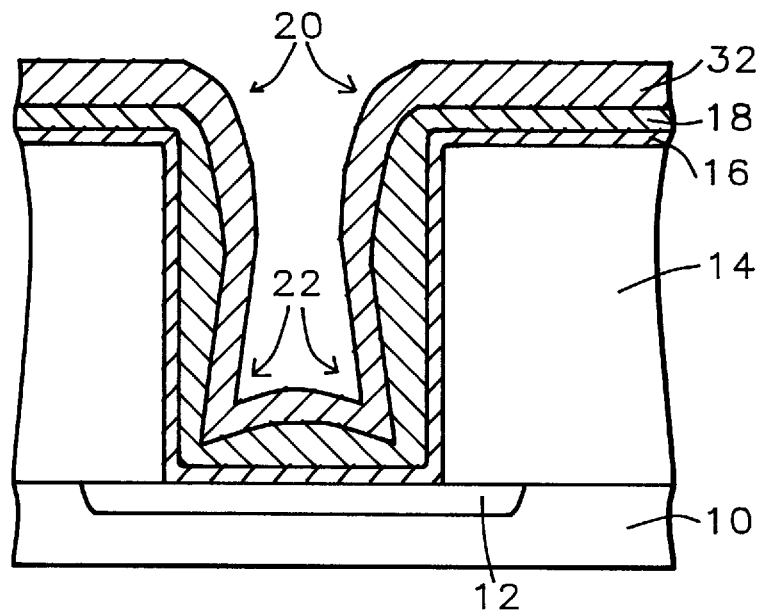

The photoresist and any sidewall polymer is then stripped in the conventional manner using an oxygen plasma leaving the profile shown in FIG. 3E. The TiN overhang 20 has been significantly reduced without detriment to the narrow regions 22 at the base of the opening. A final layer of TiN is then deposited by sputtering to give the profile shown in FIG. 3F. The TiN layer now has a more conformal vertical profile than before, now having a more substantial thickness at the base.

Figure 3G:
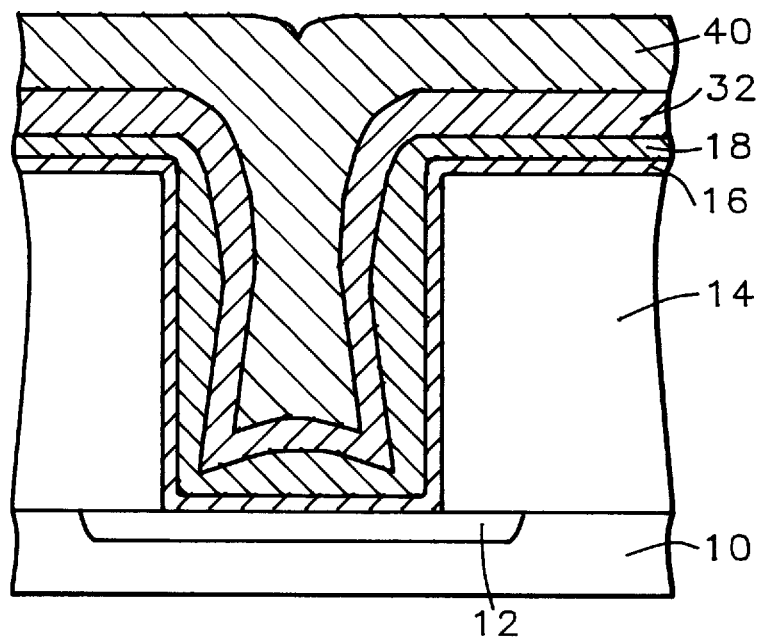

Referring now to FIG. 3G, a layer of tungsten 40 nominally between 4,000 and 6,000 Angstroms thick is deposited over the wafer by LPCVD at a temperature of between about 440° C. and 480° C. using tungsten hexafluoride($WF_6$) and hydrogen. The deposition is carried out in a cold-walled, low temperature LPCVD reactor.

Figure 3H:
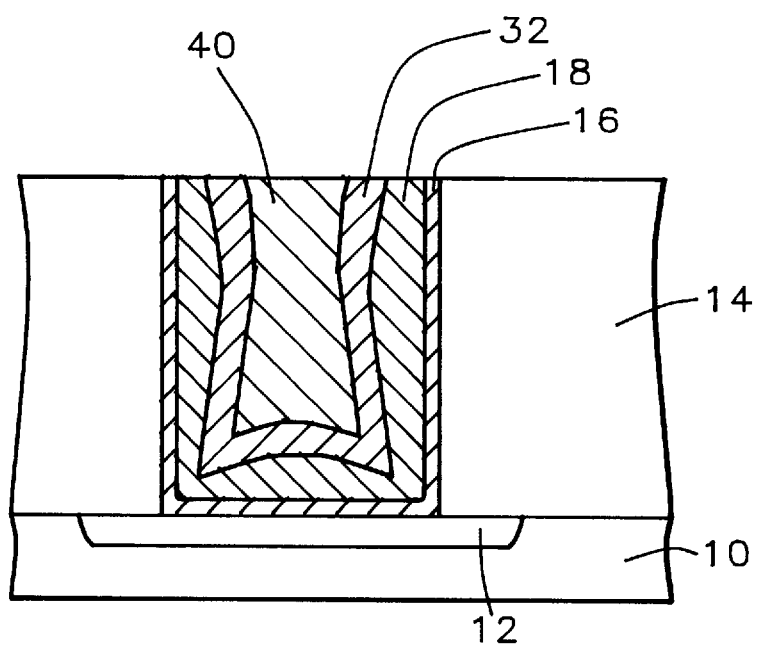

Because the walls of the contact openings have been rendered essentially vertical by the double TiN deposition, the tungsten deposition fills the contact opening without leaving voids. The tungsten layer 40 is patterned with photoresist in the conventional manner and etched back to the glass layer 14 to define the completed tungsten plugs as shown in cross section in FIG. 3H.

The tungsten plugs are subsequently contacted by the preferred interconnection metallurgy, which typically consists of an aluminum alloy, deposited and patterned on the surface of the insulating layer.

The embodiment of FIG. 2 uses a p-type substrate. It should be well understood by those skilled in the art that n-type substrate conductivities may also be used. It should be further understood that the substrate conductivity type as referred to here does not necessarily refer to the conductivity of the starting wafer but could also be the conductivity of a diffused region within a wafer wherein the semiconductor devices are incorporated. Such situations encountered in the twin-well CMOS technology.

While the invention has been particularly shown and described with reference to the preferred embodiments thereof, it will be understood by those skilled in the art that various changes in form and details may be made without departing from the spirit and scope of the invention.

What is claimed is:

1. A method of improving step coverage and conformity of a layer of material deposited by a physical-vapor-deposition technique onto a substrate having vertical walled openings with aspect ratios greater than 0.3 comprising:

providing a substrate having vertical walled openings with aspect ratios greater than 0.3;

depositing a first layer of material onto said substrate by a physical vapor deposition technique whereby non-uniform coverage is produced along the walls of said vertical walled openings, said coverage becoming progressively thinner along said walls, proceeding from the tops towards the bases of said vertical walled openings;

depositing a photoresist layer over said first layer of material;

subjecting said substrate to an etching technique having controllable isotropy and with a first set of parameters and etchants which provide an etch rate of said photoresist layer which is greater than the etch rate of said first layer of material;

etching with said first set of parameters and etchants until said first layer of material, external to said vertical walled openings, has been exposed and the surface of said photoresist layer within said vertical walled openings extends below the tops of said vertical walled openings;

adjusting said etching technique to achieve a second set of parameters and etchants which provide an etch rate of said photoresist layer which is less than the etch rate of said first layer of material;

etching with said second set of parameters and etchants until the thickness of said first layer of material planar with said substrate and external to said vertical walled openings has been reduced to approximately one-half;

removing said photoresist layer; and depositing a second layer material onto said substrate by a physical vapor deposition technique.

2. The method of claim 1 wherein the physical vapor deposition technique is selected from the group consisting of rf sputtering, rf magnetron sputtering, dc sputtering, dc magnetron sputtering and vacuum evaporation.

3. The method of claim 1 wherein the etching technique is reactive-ion-etching.

4. The method of claim 1 wherein the etching technique with the first set of parameters and etchants is anisotropic and in the direction normal to the plane of said substrate.

5. The method of claim 1 wherein the etching technique with the second set of parameters and etchants is isotropic.

6. A method for forming metal contacts to active areas of integrated circuit devices formed within the surface of a semiconductor wafer comprising:

providing a semiconductor wafer having integrated circuit semiconductor devices formed within its surface and having a layer of silicate glass over said semiconductor devices with vertical walled contact openings patterned and etched in said layer of silicate glass, exposing subjacent contact regions of said semiconductor devices;

depositing a titanium layer over said layer of silicate glass;

depositing a first layer of a barrier material over said titanium layer;

subjecting said semiconductor wafer to rapid-thermal-annealing;

depositing a first photoresist layer over said first layer of barrier material;

subjecting said semiconductor wafer to an etching technique having controllable isotropy and with a first set of parameters and etchants which provide an etch rate of said first photoresist layer which is greater than the etch rate of said first layer of barrier material;

etching with said first set of parameters and etchants until the planar surface of said first layer of barrier material, external to said vertical walled contact openings, has been exposed and the surface of said first photoresist layer within said vertical walled contact openings extends below the tops of said vertical walled contact openings;

adjusting said etching technique to achieve a second set of parameters and etchants which provide an etch rate of said first photoresist layer which is less than the etch rate of said first layer of barrier material;

etching with said second set of parameters and etchants until the thickness of said first layer of barrier material layer has been reduced to approximately one-half;

removing said first photoresist layer;

depositing a second layer of barrier material onto said semiconductor wafer;

depositing a layer of tungsten over said second layer of barrier material;

depositing a second photoresist layer;

patterning said second photoresist layer; and etching said layer of tungsten with a unidirectional dry etching technique to form independent tungsten plugs.

7. The method of claim 6 wherein said layer of silicate glass comprises:
   a bottom layer of plasma enhanced chemical vapor deposition silicon oxide; and
   a top layer selected from the group consisting of a borophosphosilicate glass and a phosphosilicate glass.

8. The method of claim 6 wherein said layer of silicate glass comprises:
   a bottom layer of plasma enhanced chemical vapor deposition silicon oxide;
   a central layer selected from the group consisting of a borophosphosilicate glass and a phosphosilicate glass; and
   a top layer of plasma enhanced chemical vapor deposition silicon oxide.

9. The method of claim 6 wherein the titanium layer is deposited by a physical vapor deposition technique selected from the group consisting of rf sputtering, rf magnetron sputtering, dc sputtering, dc magnetron sputtering and vacuum evaporation.

10. The method of claim 6 wherein the titanium layer is between about 300 and 600 Angstroms thick.

11. The method of claim 6 wherein the first layer of barrier material is titanium nitride and is between about 1,000 and 2,000 Angstroms thick.

12. The method of claim 6 wherein the first layer of barrier material is deposited by a physical vapor deposition technique selected from the group consisting of rf sputtering, rf magnetron sputtering, dc sputtering, dc magnetron sputtering and vacuum evaporation.

13. The method of claim 6 wherein the rapid-thermal-annealing is accomplished in nitrogen using a halogen lamp as a heat source.

14. The method of claim 6 wherein the temperature of the wafer surface during rapid thermal annealing is between 900° C. and 1000° C.

15. The method of claim 6 wherein the etching technique is reactive-ion-etching.

16. The method of claim 6 wherein the etching technique with the first set of parameters and etchants is anisotropic and in the direction normal to the plane of said substrate.

17. The method of claim 6 wherein the etching technique with the second set of parameters and etchants is isotropic.

18. The method of claim 6 wherein the composition of the etchants in the first set of parameters and etchants consist of between about 27 to 33 SCCM $BCl_3$, 9 to 11 SCCM $Cl_2$, and 13 to 17 SCCM $N_2$.

19. The method of claim 6 wherein the composition of the etchants in the second set of parameters and etchants consist of between about 40 to 50 SCCM $BCl_3$, 23 to 28 SCCM $Cl_2$, and 13 to 17 SCCM $N_2$.

20. The method of claim 6 wherein the pressure in the first set of parameters and etchants is between about 25 and 35 milliTorr.

21. The method of claim 6 wherein the pressure in the second set of parameters and etchants is between about 225 and 275 milliTorr.

22. The method of claim 6 wherein the first photoresist layer is removed by plasma ashing in oxygen.

23. The method of claim 6 wherein the layer of tungsten is deposited at a temperature between about 440° C. and 480° C. in a CVD system by the reduction of $WF_6$ with hydrogen.

24. The method of claim 6 wherein the thickness of layer of tungsten is between about 4,000 and 6,000 Angstroms thick.

* * * * *

UNITED STATES PATENT AND TRADEMARK OFFICE
CERTIFICATE OF CORRECTION

PATENT NO. : 5,833,817
DATED : 11/10/98
INVENTOR(S) : Chia Shiung Tsai, Ying-Ying Wang, and Chen-Hua Douglas Yu It is certified that error appears in the above-indentified patent and that said Letters Patent is hereby corrected as shown below:

On the Cover Page, at (75), delete "Ying Yin Wang" and replace with --Ying Ying Wang--.

Signed and Sealed this

Eleventh Day of May, 1999

Attest:

Q. TODD DICKINSON

*Attesting Officer*   *Acting Commissioner of Patents and Trademarks*